(12) United States Patent
McIntyre et al.

(10) Patent No.: US 7,243,325 B2
(45) Date of Patent: Jul. 10, 2007

(54) METHOD AND APPARATUS FOR GENERATING A WAFER MAP

(75) Inventors: Thomas J. McIntyre, Nokesville, VA (US); Scott K. Arnold, Gainesville, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 394 days.

(21) Appl. No.: 10/896,190

(22) Filed: Jul. 21, 2004

(65) Prior Publication Data

US 2006/0031801 A1    Feb. 9, 2006

(51) Int. Cl.
  *G06G 17/50* (2006.01)
(52) U.S. Cl. .......................................... 716/8; 716/18
(58) Field of Classification Search .................... 716/8, 716/18
  See application file for complete search history.

(56) References Cited

U.S. PATENT DOCUMENTS

| | | | | |
|---|---|---|---|---|
| 5,305,222 A | * | 4/1994 | Nakamura ................ 700/121 |
| 5,699,260 A | * | 12/1997 | Lucas et al. ............. 700/121 |
| 6,016,391 A | * | 1/2000 | Facchini et al. ............ 716/21 |
| 6,070,004 A | * | 5/2000 | Prein ........................... 716/10 |
| 6,526,547 B2 | * | 2/2003 | Breiner et al. ................ 716/4 |
| 6,604,233 B1 | * | 8/2003 | Vickery et al. .............. 716/19 |
| 6,714,885 B1 | * | 3/2004 | Lee ............................. 702/84 |

* cited by examiner

*Primary Examiner*—Sun James Lin
(74) *Attorney, Agent, or Firm*—Daniel J. Long; Robert K. Tendler

(57) ABSTRACT

A system is provided to aid in laying out circuits on a semiconductor wafer, in which a wafer map is automatically generated when entering chip sizes, arrangements and other enterable factors, with a goal to maximize yield probability. The subject system accommodates different chip types and arrangements within a wafer map and addresses edge exclusion, utilization of chiplets and accommodation of different centering techniques, including a variety of ways of measuring offsets, while outputting a display of replicated circuits on the wafer as well as chip count and density, utilizing a portable, tailorable, extendable PC-based program featuring an easy-to-use graphical interface. The software application provides a user with different graphical views customized for different process areas, such as lithography and dicing, with the application being useful for any semiconductor manufacturing facility, foundry or similar industry that needs to generate wafer maps automatically to maximize yield probability.

21 Claims, 8 Drawing Sheets

Application Startup Flow

WAFER MAP DESCRIPTION:

Product Name: MOZAC — 30

Stepper Name: ASML 5500 — 32

WAFER MAP DATA:

| | | | | |
|---|---|---|---|---|
| Wafer Size | 125 — 34 | | Edge Exclusion | 5 — 36 |
| Periodicity X | 17.052 — 38 | | Periodicity Y | 17.6 — 40 |
| Chiplet Rows | 0 — 42 | | Chiplet Columns | 0 — 44 |
| Chiplet Size X | 2 — 46 | | Chiplet Size Y | 2 — 48 |
| X-Offset | 0 — 50 | | Y-Offset | 0 — 52 |

Submit — 54    Calculate — 56    Reset — 58    Seek — 60

Sidebar: MCS Home, Help, Define Product, Product, Clear BOMs, BOMs, Levels, Masks by Lot, Lots, Lithography Worksheet, Wafer Maps, Users

METHOD AND APPARATUS FOR GENERATING A WAFER MAP

FIELD OF THE INVENTION

This invention relates to wafer design and fabrication and more particularly to an automatic design system for replicating circuits across a wafer.

BACKGROUND OF THE INVENTION

The capability of pattern 20 to 40 levels on wafers has resulted in the ability to fabricate large numbers of integrated circuits on a single wafer and to dice the wafer so as to provide individual integrated circuits or combinations of circuits.

Typically in wafer fabrication, a stepper is utilized which photographically replicates or reproduces a particular pattern of a layer for an integrated circuit across the wafer in a stepped fashion so that identical circuits can be fabricated across a given wafer.

For instance, taking a first metalization layer, one must first take a picture of the layer for the first chip to be replicated. One must then step to the next place where one wants to place a copy of the metalization layer, open the shutter and take the picture and then step to the next place in a step-and-repeat process performed by a so-called stepper. A photomask for microlithography is typically a quartz tile a quarter-inch thick and is covered with chrome. The chrome is then covered with photo-resist and, for a given level, a pattern is written onto the photo-resist and then the chrome is etched. When this tile is flipped upside down, it becomes a chrome-on-glass master mask for that particular level. One might have 20 to 40 of these master masks per device, depending on the number of levels required. With the masks, one goes layer by layer to build up the chip.

However, every time, one has to manually come back to photo and lay out the chips on the wafer in a desired pattern. It is noted that often times one puts down product chips at certain locations and then test chips or other product chips on the same wafer.

In terms of the design of a chip pattern on a wafer, the photo tooling that is capable of adequate resolution and overlay does not have the field size to be able to print the entire wafer at once.

To simplify, the mask contains a pattern for the circuitry for just one chip or if small enough for several chips or "chiplets". Sometimes the complete integrated circuit is small enough to fit more than one chip image on a mask and subsequent exposure field. These are then referred to as "chiplets" for the purposes of wafer layout. With a wafer having a six-inch diameter, the wafer can accommodate 20 or more of these exposure fields. One first designs the chip, then fractures the data, then has a mask manufacturer write the data to a series of masks, with the artwork being replicated, for instance, 40 times for the 40 chips that are to be placed on the wafer.

Just designing a single chip and providing the photolithography and manufacturing step for the chip, while indeed complicated, is further complicated when one wants to replicate the process across a wafer and make efficient use of wafer real estate to be able to place the maximum number of chips on a given-size wafer. The chip designers then defer to the photo layout engineers, who manually create a pattern of the tile is flipped upside down, it becomes a chrome-on-glass master mask for that particular level. One might have 20 to 40 of these master masks per device, depending on the number of levels required. With the masks, one goes layer by layer to build up the chip.

However, every time, one has to manually come back to photo and lay out the chips on the wafer in a desired pattern. It is noted that often times one puts down product chips at certain locations and then test chips or other product chips on the same wafer.

In terms of the design of a chip pattern on a wafer, the photo tooling that is capable of adequate resolution and overlay does not have the field size to be able to print the entire wafer at once.

To simplify, the mask contains a pattern for the circuitry for just one chip or if small enough for several chips or "chiplets". Sometimes the complete integrated circuit is small enough to fit more than one chip image on a mask and subsequent exposure field. These are then referred to as "chiplets" for the purposes of wafer layout. With a wafer having a six-inch diameter, the wafer can accommodate 20 or more of these exposure fields. One first designs the chip, then fractures the data, then has a mask manufacturer write the data to a series of masks, with the artwork being replicated, for instance, 40 times for the 40 chips that are to be placed on the wafer.

Just designing a single chip and providing the photolithography and manufacturing step for the chip, while indeed complicated, is further complicated when one wants to replicate the process across a wafer and make efficient use of wafer real estate to be able to place the maximum number of chips on a given-size wafer. The chip designers then defer to the photo layout engineers, who manually create a pattern of the desired chips across the wafer, which involves the pattern of the chip placement on the actual wafer.

While there exist steppers, such as provided by ASML of the Netherlands, what these steppers do are to step out pictures across the surface of the wafer in a pattern manually determined by the layout engineer.

However, the software for the steppers is relatively simplified and doesn't take into account the fact that one may wish to replicate different chips across the wafer and does not, for instance, take into account how to maximize the density of the chips, given the type of chips and placement one wishes. The stepper does not provide for a graphical interface which, aside from laying out the individual chips, accommodates such things as edge exclusion zones or edge areas that, while not being able to accommodate a full-sized chip, may nonetheless be utilized to fabricate so-called chiplets. Thus, with the stepper type of systems, there is no way to maximize the yield by being able to recognize that chiplets are possible, with the chiplets being manufacturable at the same time as the chips or full exposure field.

There is therefore a need for a system which allows the designer to enter in various parameters, such as wafer size, edge exclusion, flat-edge exclusion, periodicity in X and Y directions, and offsets in X and Y directions.

Also, when the integrated circuit chip is composed of a number of integrated circuits, oftentimes each of this number of integrated circuits can be characterized as a chiplet. Thus, when there is not enough room on a wafer for a complete chip, chiplets can be positioned on the wafer so they can be manufactured at the same time that the chips are manufactured. There is therefore a need for the layout engineer to be able to specify the location of these chiplets on the wafer, which involves specifying the number of chiplet rows and the number of chiplet columns. Moreover, it is important for the layout engineer to be able to specify the wafer type, meaning whether or not the wafer is notched or flat.

As will also be appreciated, there needs to be a way for the mask engineer to be provided with a wafer map or visual representation of where the chips and chiplets are on a wafer. Also there is a requirement to permit the designer to enter in field parameters, such as Usable Field attributes, Edge Field attributes and chiplet attributes.

Most importantly, there needs to be a graphical interface to be able to visually present to the wafer designer the placement of the various chips and chiplets, the areas which have the Usable Fields with circuits, or Edge Fields, which may or may not have circuits on them, as well as to indicate the number of chips and chiplets that are achievable with a given pattern. Note that a useable field is a field in which the outline of the chip does not touch the edge exclusion ring for the wafer, whereas an Edge Field is one in which at least a portion of the chip is in the exclusion region.

With such a handy tool in place, the wafer designer may lay out wafers not only by simply brute force replicating chips across a wafer, but rather placing them, organizing them in terms of the offset and other characteristics of the chips themselves, by defining chiplets and placing them at points where an edge exclusion does not affect the formation of the chiplet, and then by presenting the wafer designer with a chip count for his or her design.

SUMMARY OF INVENTION

Rather than manually laying out a pattern of chips on a wafer, in the subject system the pattern is automatically generated by filling out a number of fields on a web page, in one embodiment, and having the system calculate the arrangement of the chips and chiplets and present to the designer the results of the arrangement in terms of a wafer map, along with the chip count achieved by the particular pattern.

In one embodiment, the designer is presented with a normal view of the layout of the chips as automatically performed; a stepper view, meaning how the layout is viewed by the stepper in terms of providing for replicated photographs of the various layers across the chip; and also a dicing view in which the designer can see how the wafer can be diced up to provide for the individual fabricated chips or chiplets.

Aside from predetermining the size of the chip or chiplets, one can review the results of an automatic operation when a chip is centered, when a chip corner is centered, when a chip side is centered, when the center of a chip is offset, and when a corner of a chip is offset. One can also specify the offsets in each of these cases and be presented with a result that visually indicates the automatically generated layout of the chips on the wafer.

The functionality of the subject system and its software to maximally lay out chips or chiplets on a wafer in a way that allows the designer to change various parameters such as edge exclusion, chip size, periodicity, grid offset, chiplet size, and wafer size. The system allows the designer to input chiplet dimensions in rows and columns within an exposure field. It also gives the designer graphical views customized for the different process areas such as lithography and dicing.

The result is a software application that generates a wafer layout map by inputting differing chip sizes, periodicities, arrangements, wafer sizes, edge exclusions, views, chip sites, chip types, and chiplet sizes. The application also calculates the number of chips and chiplets of each type that are laid out on a given wafer. The application graphically displays the wafer maps and allows designers to interactively change the parameters to suit their process needs.

Note that once the wafer has been laid out, the wafer design may be passed as a data set to a commercial stepper such as the ASML stepper.

In one embodiment, the wafer designer first provides input parameters enterable at the designer's screen or from a database. The application then determines Usable Fields, determines Edge Fields, and determines chiplets within Edge Fields. Thereafter, the application initializes the state of usable and Edge Fields, initializes the state of chiplets within the Edge Fields and initializes the edge exposure region. The system then computes the chip counts and draws a pattern of Usable Fields, Edge Fields, chiplets and the edge exclusion region.

Once being provided with a normal view, the wafer designer can update the pattern by placing a cursor on an x-y position. The application then searches for a Usable Field that bounds the cursor x-y position. If a Usable Field is found, then the application updates the state of Usable Fields and updates the chip counts. If no Usable Field is found, meaning that a field touches the edge exclusion region, then the application searches for Edge Fields that bound the cursor x-y position. An Edge Field is one in which there is some room to put down a chiplet without violating the edge exclusion region, but not enough room for a complete chip. If no Edge Field is found, the process ends. If an Edge Field is found, then the application decides whether or not there are chiplets contained in the Edge Field. If there are chiplets contained, then the application updates the state of the chiplets and updates the chip count. If there are no chiplets, again, the state of the Edge Field is updated and there is an update in chip counts.

A user can thus enter and thereby generate wafer layout maps automatically by entering the desired parameters in a web-based or standalone program. The user can also designate chiplet offsets or vary the orientations of the chips or chiplets. The user obtains the wafer map that automatically maximizes yield probability, distinguishes between chip types and can view maps in different modes.

The subject system thus solves the problem where no commercial software is available to create wafer maps showing chip sizes, arrangements and maximizing yield probability. While in the past wafer maps had to be created manually based on engineering judgment for maximum yield probability, the subject system now does so automatically. While in the past it was not possible to address different chip types or arrangements within a wafer map, one can now do so while at the same time addressing edge exclusion properties, chiplets, offsets, and to present the data with different map viewing capabilities.

The result is a portable, tailorable, extendable system that can be run on a desktop PC or as a web-based program featuring an easy-to-use graphical interface. The subject system provides exceptional functionality, allowing designers to change various parameters and even allows the designer to input chiplet dimensions in rows and columns within an exposure field. The subject system also provides the designer with different graphical views customized for different process areas and is very useful for any semiconductor manufacturing facility, foundry, or similar industry that needs to generate wafer maps automatically to maximize yield probability.

In summary, a system is provided to aid in the laying out of circuits on a semiconductor wafer, in which a wafer map is automatically generated when entering chip sizes, arrangements and other enterable factors, with the goal to maximize yield probability. The subject system accommodates different chip types and arrangements within a wafer map and addresses edge exclusion, the utilization of chiplets and the accommodation of different centering techniques, including a variety of ways of measuring offsets, while outputting a display of the replicated circuits on the wafer as well as chip count and density, utilizing a portable, tailorable, extendable PC-based program featuring an easy-to-use graphical interface. The software application provides the user with different graphical views customized for the different process areas, such as lithography and dicing, with the application being useful for any semiconductor manufacturing facility, foundry or similar industry that needs to generate wafer maps automatically to maximize yield probability.

BRIEF DESCRIPTION OF THE DRAWINGS

These and other features of the subject invention will be better understood in connection with a Detailed Description, in conjunction with the Drawings, of which:

FIG. 3 is a screen shot of the computer of FIG. 1, illustrating fields in which data relating to wafer size, periodicity, chiplet rows, chiplet size and offsets in orthogonal directions may be entered;

DETAILED DESCRIPTION

Figure 1:
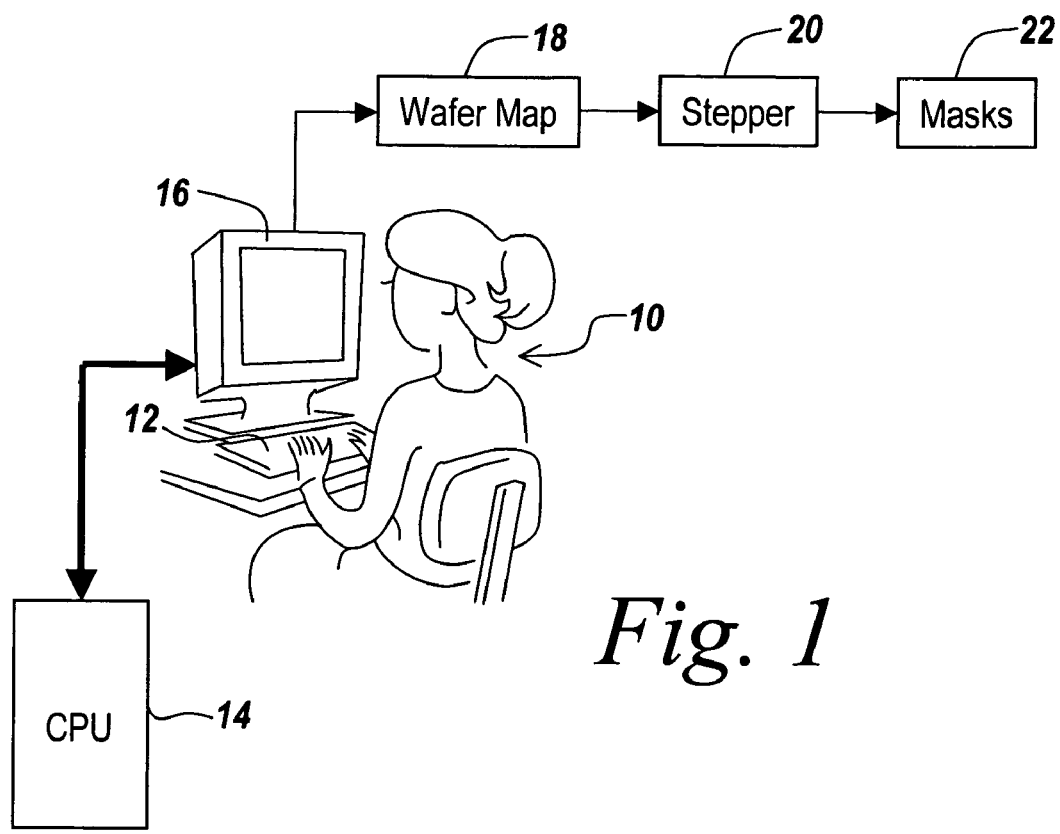
FIG. 1 is a diagrammatic illustration of an individual utilizing the subject system to generate a wafer map, the output of which, in turn, could be coupled to a stepper.

Referring now to FIG. 1, rather than manually laying out a wafer map and rather than utilizing the normal stepper software to provide a wafer layout, in the subject invention, an individual 10 at a keyboard 12 for computer 14 views a display screen 16 and enters in various parameters relating to the wafer map the individual seeks to generate. The wafer map, which is the layout of the chips or chiplets on a wafer, specifies the number of chips that can be successfully laid out, given the area and the size of the chips or chiplets that are to be fabricated onto the specified wafer.

In the past it was assumed that all the chips were to be of the same size and of the same functionality, such that they were simply laid out in a standard format. However, it is possible to increase the density on a given wafer for the integrated circuits utilized by understanding that some of the integrated circuits are made up of different subcomponents or circuits, herein referred to as chiplets, and by changing other parameters such as centering. By arranging the wafer map, taking into an account an exclusion zone or region around the periphery of the wafer and being able to visually ascertain where a particular layout touches or infringes upon the exclusion region, one can optimally and automatically lay out a wafer by placing of the chips and the chiplets for maximum benefit.

After the computer has performed the appropriate calculations, CPU 14 generates a wafer map 18, the data from which is coupled to stepper 20, which then provides the stepped photography to be able to generate masks 22.

Figure 2:
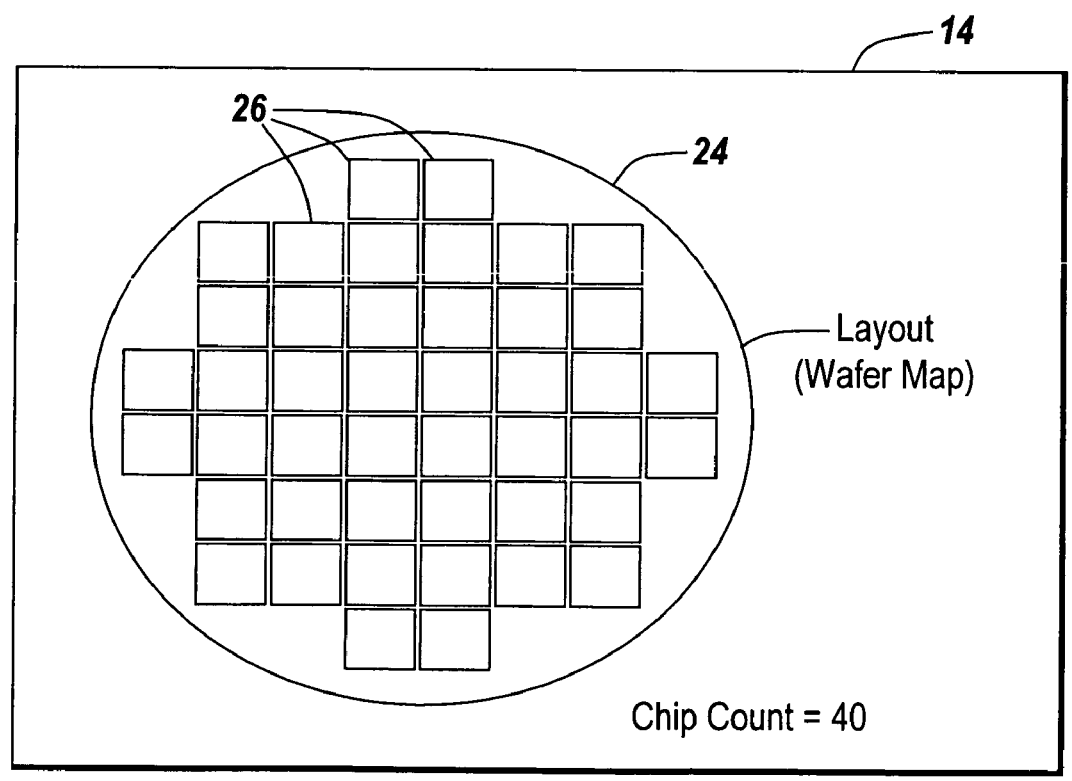
FIG. 2 is a diagrammatic illustration of the wafer map generated in FIG. 1, including the layout of the individual chips and chiplets as well as the display of a chip count to indicate yield.

Referring to FIG. 2, wafer map 18 generated by CPU 14 is displayed in terms of a wafer 24 having chips or chiplets 26 arrayed across the face of the wafer in accordance with calculations automatically done by CPU 14. The layout of the chips and chiplets is referred to as the wafer map. The display at least in one instance provides a chip count so that individual 10 can ascertain at a glance whether or not the parameters that he has inputted by means of keyboard 12 into fields presented to him on display 16, have in fact increased or decreased the chip count. If the chip count has not been increased to the individual's satisfaction or has in fact decreased, the individual can again re-enter or change the parameters inputted to CPU 14 so that the individual can manipulate the parameters to achieve a desired density or layout of the chips or chiplets on the wafer.

Table I is a listing of product parameters and field parameters that are inputtable by individual 10 to generate the automatic chip or chiplet layout. The product parameters are specified by the user for new wafer maps or are retrieved from a database for existing wafer maps. The field parameters are retrieved from the database for existing wafer maps only.

TABLE I

| APPLICATION INPUT PARAMETERS | |
|---|---|
| Product Parameters specified by user (new wafer maps) or retrieved from database (existing wafer maps): | |
| Product Name | Product name associated with the wafer map. |
| Wafer Size | Wafer map diameter (in mm). |
| Edge Exclusion | Size of wafer map edge exclusion region (in mm). |
| Flat Edge Exclusion | Wafer map flat edge exclusion. |
| Periodicity X | Periodicity X value (in mm). |
| Periodicity Y | Periodicity Y value (in mm). |
| Offset X | Wafer map x-offset from center value |

TABLE I-continued

APPLICATION INPUT PARAMETERS

| | |
|---|---|
| | (in mm). |
| Offset Y | Wafer map y-offset from center value (in mm). |
| Number of Chiplet Rows | Maximum number of chiplet rows per Edge Field. |
| Number of Chiplet Cols | Maximum number of chiplet columns per Edge Field. |
| Scale Factor | Factor used in scaling the wafer map. |
| Wafer Type | Type of wafer map (notched or flat). |
| Field Parameters Retrieved from Database (existing wafer maps only): | |
| Usable Field Attributes | Upper left and lower right (x, y) positions, state, and quadrant. |
| Edge Field Attributes | Maximum upper and lower (x, y) positions, state, and quadrant |
| Chiplet Attributes | Upper left and lower right (x, y) positions, state, and quadrant. |

What will be seen is that at the user's discretion he can specify the wafer size, the edge exclusion region or zone, the flat edge exclusion region, periodicity in the x and y directions as well as offsets in the x and y directions, together with the number of chiplet rows and columns which refers to the maximum number of chiplet rows and columns per Edge Field. The individual can also enter into the system a scale factor used in scaling the wafer map and the wafer type, meaning whether it is notched or flat.

It will be appreciated that by being able to enter various parameters into the system before the automatic layout of the chips and chiplets to provide the wafer map, one can fine-tune or increase productivity by being able to see at a moment's glance the effect of the changes of the parameters and the resulting chip count so as to be able to know the effect of a given change in the parameters.

It is also possible to identify both chips and chiplet types so that one can specify what constitutes a chiplet and be able to place it at an appropriate position in the wafer map so as to maximize not only the number of chips that can be accommodated by the wafer but also the number of chiplets.

Referring now to FIG. 3, the screen shot indicates a product name may be assigned in field 30, a stepper name in field 32 and as to the wafer map data, the wafer size as illustrated in field 34. The user can specify the edge exclusion zone or region in field 36 and the x periodicity in field 38 as well as the y periodicity in field 40.

One can also set the maximum number of chiplet rows as illustrated in field 42 and the maximum number of chiplet columns as illustrated in 44, whereas in field 46 one can set the chiplet size in the x direction and in field 48 the chiplet size in the y direction. One can also specify in field 50 the x offset and in field 52 the y offset. Clickable regions 54 for submit, 56 for calculate, 58 for reset and 60 for going back make the subject system user friendly.

Figure 4:
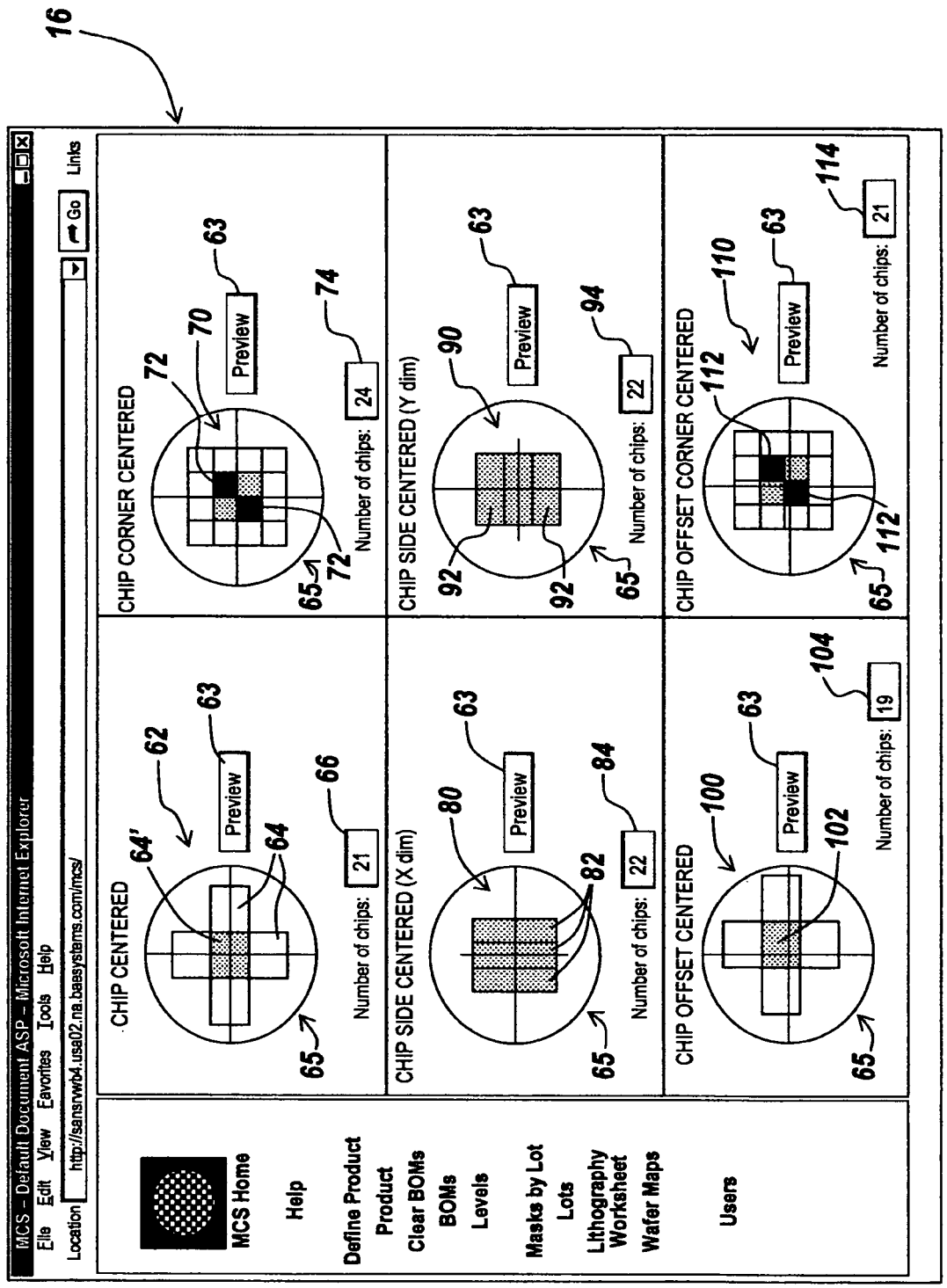
FIG. 4 is a screen shot of the computer of FIG. 1, illustrating chip layouts used in determining centering, providing selectability for chip center centering, chip corner centering, chip side centering in either the x or y direction, chip center offsetting or chip corner offsetting, also indicating that with a change in centering, a different number of chips can be laid out on a wafer.

Referring now to FIG. 4, what is presented to the user on display 16 is the effect of particular centering procedures and offset procedures. As illustrated at 62, a series of chips 64 are shown arranged such that the center of chip 64' is centered in the crosshairs 65 of the system. It will be noted that the system calculates the number of chips arrangeable within a given wafer and displays it in field 66 with the click of a preview button 63.

Should, for instance, a chip corner be desired to be centered, then as illustrated at 70, the corner of chip 72 is centered in crosshairs 65 as illustrated, and the resulting number of chips with this type of arrangement is displayed at field 74. Again, the view is presented by the clicking on the preview button 63.

If one chooses to center the chip on a horizontal side or edge, then as illustrated at 80, chips 82 are indicated as having their horizontal edge centered along the horizontal crosshair, with the number of chips associated with such a centering arrangement illustrated in field 84, again through clicking on the preview button 63.

On the other hand, if it is desired to center the chips on a vertical edge as illustrated at 90, then chips 92 are shown centered along the vertical crosshair, with the corresponding number of chips to be produced by such a centering illustrated in field 94, again through clicking the preview button 63.

Another way of potentially increasing the yield for the wafer is to off-center the entire chip map by off-centering or offsetting the center of a chip as illustrated at 100, with chip 102 being off-centered in crosshairs 65, with the number of chips for this arrangement being shown in field 104, again with a clicking of preview button 63.

If on the other hand it is desired to offset a corner of chips as illustrated at 110, then chips 112 will have their corners offset with respect to crosshairs 65 and, as illustrated in field 114, the number of chips will be calculated upon clicking preview button 63.

Figure 5:
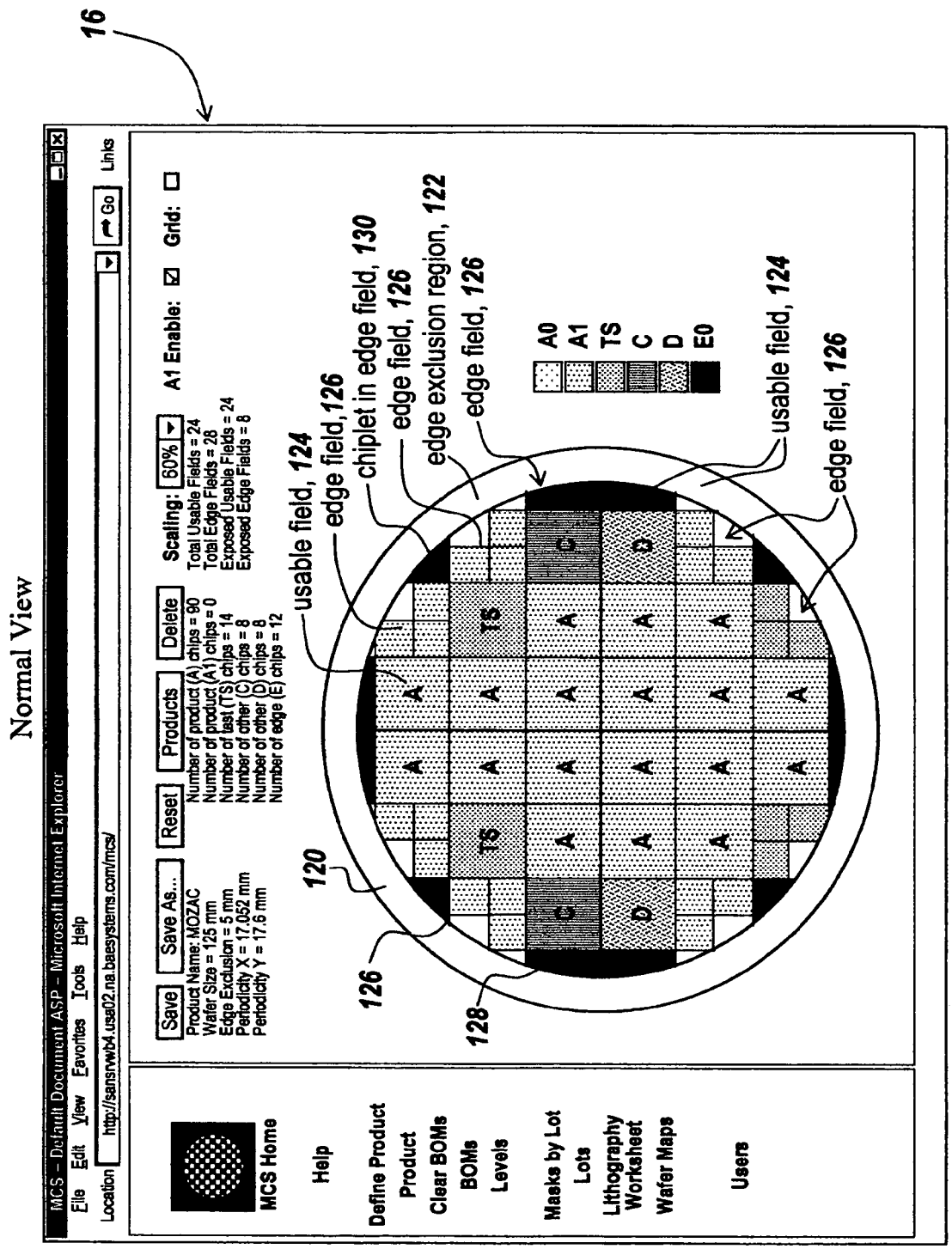
FIG. 5 is a screen shot of a normal view of the chip layout, indicating a number of chips that exist in Usable Fields, a number of chips which, through the utilization of chiplets, exist in an Edge Field for which at least some region is free of edge exclusion constraints and in which an edge exclusion region for the wafer is shown.

Referring now to FIG. 5, display 16 of FIG. 1 shows a rendering of the wafer map in which in the normal view, the periphery of the wafer 120 is shown with an edge exclusion region 122. This region refers to the fact that no chips or chiplets can be successfully laid out in this area, since the area is so close to the periphery of the wafer. Laid out within the exclusion zone or region are a number of Usable Fields 124, which are designated with letters A, C, D and TS. Shown on the screen at the upper portion are the parameters entered.

Here, A refers to a chip that may include a number of individual integrated circuits, as do chips C and D. These chips are arrayed in a cross-like fashion so that, at least as far as the Usable Fields are concerned, they all fit and do not touch the edge exclusion region. Thus, the term Usable Field means that, for a chip of a given size, it can be located in a Usable Field without fear of intruding upon the edge exclusion region.

Also indicated in this figure are Edge Fields 126, which refers to areas or fields, some of which touches the exclusion region.

There are some Edge Fields, such as indicated at 128, for which no subdivided chips or chiplets can be manufactured. This is simply because there is not enough space to provide for a subdivided circuit or chiplet. However, as can be seen at 130, a chiplet, which is a subdivided portion of a chip, can successfully be located on the wafer without touching the edge exclusion region. For this reason, it is possible to lay out a wafer so as to provide usable space for chiplets as opposed to the chips themselves, which are larger.

For instance, if a chip is a field-programmable gate array (FPGA) that includes a number of separate circuits, to increase yield one may wish to fabricate several of the separate circuits on the same wafer as the total FPGA chips, thus to make use of the available space. One therefore designates the so-called chiplets, which are smaller in size than the FPGA chips themselves.

The result of the subject system is that on can visually represent the wafer layout or design with a program that will locate not only chips of a given size but also chiplets of a given size so that they can be successfully patterned onto the wafer without violating the edge exclusion region or zone.

Figure 6:
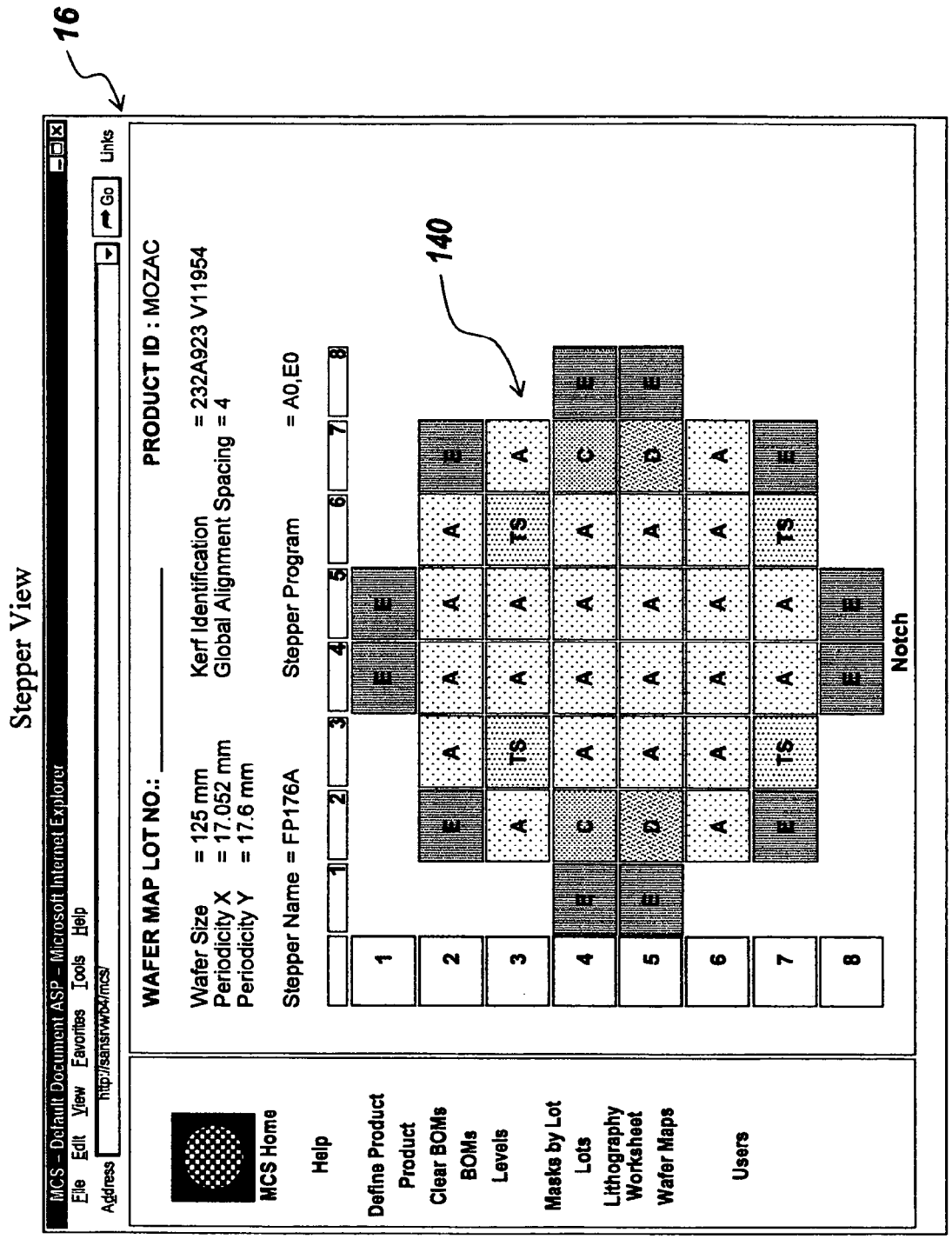
FIG. 6 is a screen shot of the stepper view for the wafer layout.

Referring to FIG. 6, display 16 can be made to display the stepper view of the data outputted from the wafer-mapping application. Here it can be seen that from the stepper point of view, the stepper recognizes chips in Usable Fields such as chips 140, which are designated by capital letters. The designation E refers to areas in which chiplets do not exist in an Edge Field.

Figure 7:
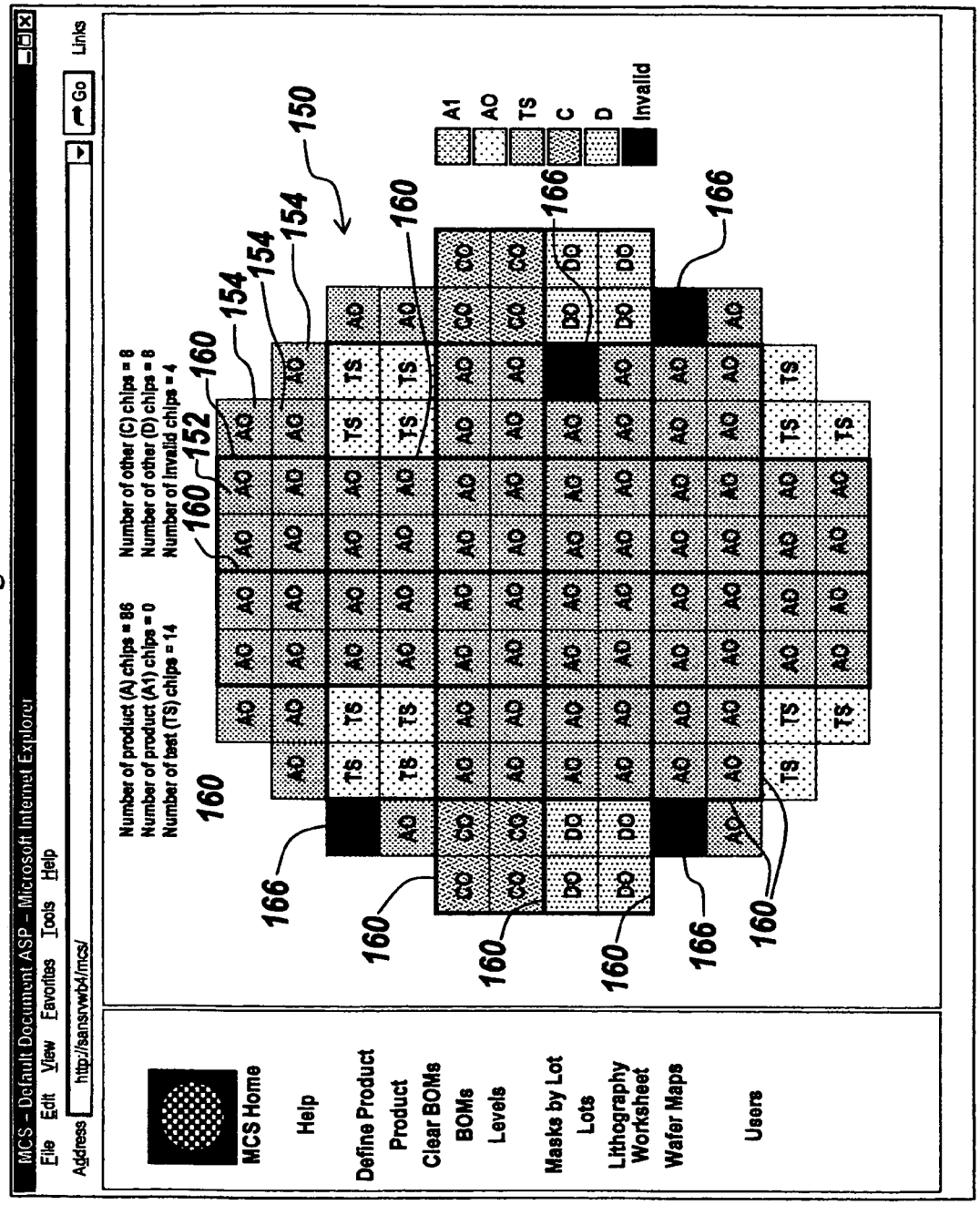
FIG. 7 is a screen shot of the computer of FIG. 1, illustrating that for a given wafer map, dicing lines are shown indicating where the wafer may be scribed so that individual chips or chiplets may be broken off.

Referring to FIG. 7, as illustrated at 150, a dicing view of the wafer map of FIG. 5 is shown in which it can be readily seen that a chip is either in a Usable Field or an Edge Field. Here chip 152 labeled $A_0$ is in a Usable Field. However, chiplets 154, also labeled $A_0$, exist in an Edge Field. It is also noted that, since one can subdivide chip A into subcomponents or chiplets $A_0$, these chiplets will be manufactured where possible within an edge exclusion zone or region such that chiplets 154 can be produced at the same time their corresponding chips 152 are produced.

In this figure, the scribe lines for dicing, here shown at 160, are shown so as to give the individual 10 of FIG. 1 an idea of how the wafer that he has designed can be diced into individual product. Also, shown in the dicing view of FIG. 7 is that there are invalid zones 166 for which no chips or chiplets will be available.

Here it takes some designer skill to be able to look at a chip and see what useful subcircuits can be manufactured at the same time as the corresponding chip.

Figure 8:
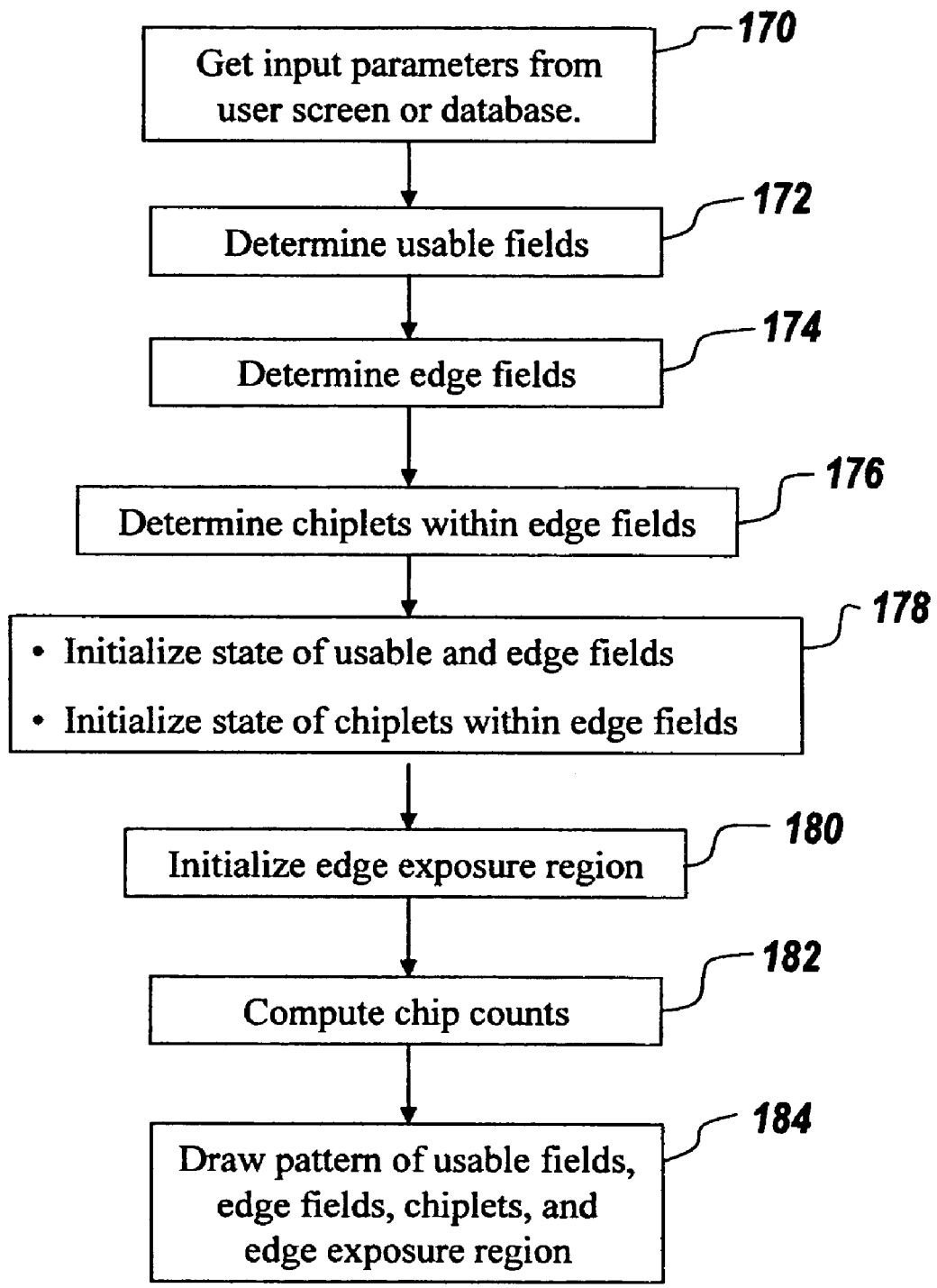
FIG. 8 is a flow chart showing how input parameters are treated in terms of determining Usable Fields, usable Edge Fields, chiplets within Edge Fields, initialization states and the initialization of edge exposure regions, followed by the computation of chip counts and the drawing of Usable Fields, Edge Fields, chiplets and edge exposure regions, given selected parameters; and, FIG. 9 is a flow chart illustrating how to update the normal view of the wafer map so as to be able to include more chips or chiplets, thus to be able to update the wafer map and the parameters, and to calculate chip counts associated therewith.

Referring now to FIG. 8, in terms of the application flow at startup, individual 10 gets input parameters from the user screen or database as illustrated at 170. The system then determines Usable Fields as illustrated at 172 and Edge Fields, as illustrated at 174. The Usable Fields are calculated from the size of the chips, whereas the Edge Fields are calculated as being those fields that contain chips but that touch the edge exclusion region.

The system then determines if it is possible to have chiplets within the Edge Fields of 174 as illustrated at 176 and, as illustrated at 178, provides an initialized state of usable and Edge Fields and an initialized state of chiplets within those fields. The state of a field refers whether or not it is to be exposed and, if exposed, the type of chips contained in the region. The states of the Usable Fields within the wafer map are initialized to indicate exposed regions of product chips on the wafer map. The initial states of Edge Fields for the wafer map depends on whether chiplets are contained within its boundary. For Edge Fields that have chiplets, the initial states are set to display exposed regions of product chiplets on the wafer map. For Edge Fields that do not contain chiplets, the initial states are set to show unexposed regions on the wafer map.

As illustrated at 180, the system initializes the edge exposure region based on the a priori knowledge of the wafer. In this context initializing an edge exclusion region means setting the initial state of Edge Fields that do not contain chiplets.

After the application arranges all of the chips and chiplets, the application computes chip counts as illustrated at 182.

After the system lays out the chips and chiplets, given the parameters entered, the system draws a pattern of Usable Fields, Edge Fields, chiplets and the Edge Exclusion Region as illustrated at 184.

Figure 9:
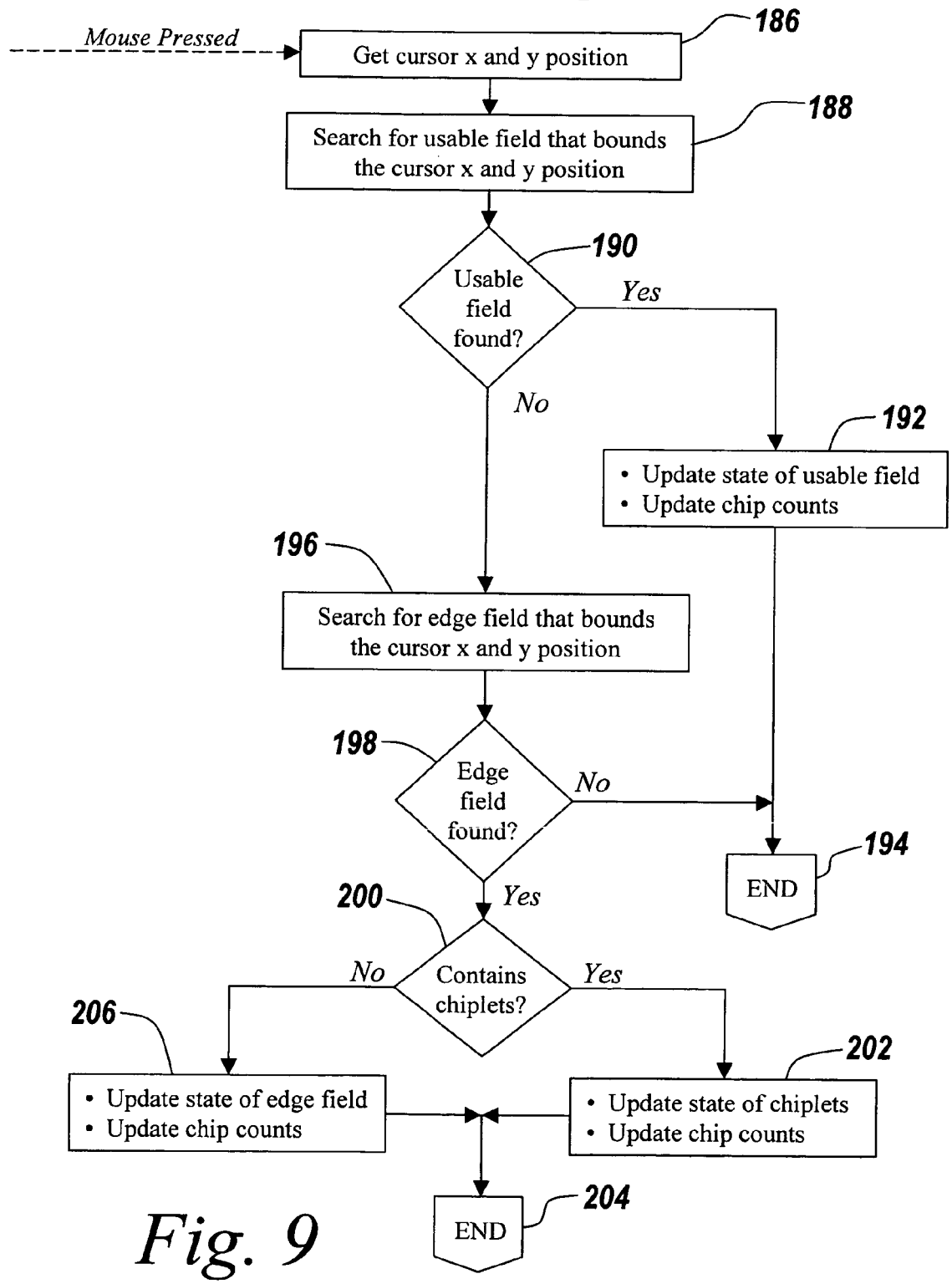

Referring to FIG. 9, if individual 10 of FIG. 1 seeks to update or change the normal view he is presented with, then with a mouse, the individual sets a cursor on an x and y position as illustrated at 186, at which point a search at 188 is performed for a Usable Field that bounds the cursor x-y position. As illustrated at 190, if there is a Usable Field found, then as illustrated at 192 the system updates the state of the Usable Fields and updates the chip counts, at which point the system stops as illustrated at 194. If no Usable Field is found at 190 for a particular x-y position of a chip, then a search is performed at 196 for an Edge Field that bounds the cursor x-y position. If an Edge Field is found as illustrated at 198, then a determination at 200 is made as to whether or not the Edge Field contains chiplets. If so, as illustrated at 202, there is an update of the state of the chiplets and an updated chip count, at which point the process stops as illustrated at 204.

If there are no chiplets in the particular Edge Field found, then the system updates the state of the Edge Field, as illustrated at 206 and updates the chip counts, at which point the process ends as illustrated at 204.

What is now presented is a program listing in Java that describes the generation of the wafer map in all of its forms, given the various inputs described above.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method for aiding in laying out a number of integrated circuit chips on a semiconductor wafer, comprising steps of:
    automatically generating a wafer map taking into account predetermined parameters, the wafer map automatically maximizing the number of integrated circuit chips to be laid out on a predetermined size wafer;
    displaying the automatically generated wafer map including displaying type of chip with the chip being divided into chiplets; and,
    displaying indicia representing chiplets.

2. The method of claim 1 further including a step of using the automatically generated wafer map to control a stepper.

3. The method of claim 2, wherein the stepper photographically replicates patterning of images of an integrated circuit for a number of chips onto photoresist carried by the semiconductor wafer so as to replicate the pattern for a layer of the integrated circuit such that the pattern is reproduced across the semiconductor wafer in accordance with the wafer map.

4. The method of claim 1, wherein the predetermined parameters include wafer size.

5. The method of claim 1, wherein the predetermined parameters include chip size.

6. The method of claim 1, wherein the predetermined parameters include an exclusion zone for the semiconductor wafer.

7. The method of claim 1, wherein the predetermined parameters include centering type.

8. The method of claim 7, wherein the centering type parameter includes offset.

9. The method of claim 8, wherein the centering type is selected from a group consisting of chip center centered, chip corner centered, chip side centered, chip offset centered and chip offset corner centered centering types.

10. The method of claim 1 further including a step of displaying the automatically generated wafer map.

11. The method of claim 10, wherein the displaying step includes displaying a stepper view.

12. The method of claim 10, wherein the displaying step includes displaying a dicing view.

13. The method of claim 10, wherein the displaying step includes displaying a view of the semiconductor wafer map on the wafer as the chips represented by the semiconductor wafer map would appear on the semiconductor wafer.

14. The method of claim 10 further including a step of displaying usable fields.

15. The method of claim 10 further including a step of displaying edge fields.

16. The method of claim 10 further including a step of indicating invalid layout regions for chips.

17. The method of claim 16 further including a step of displaying an edge exclusion region, and wherein an invalid layout region is one in which a portion of a chip lies in the edge exclusion region.

18. The method of claim 10 further including a step of displaying type of chip.

19. The method of claim 1 further including a step of displaying indicia indicating invalid chiplets.

20. The method of claim 1 further including a step of displaying a chip count for the automatically generated wafer map, thus to display result of the automatically generated wafer map.

21. The method of claim 20 further including steps of:
altering the predetermined parameters to obtain modified parameters; and
displaying chip count result for the modified parameters, thus to permit maximizing utilization of wafer real estate by selection of parameters for automatic wafer mapping.

\* \* \* \* \*